United States Patent [19]

McGann et al.

[11] Patent Number: 4,868,889
[45] Date of Patent: Sep. 19, 1989

[54] MICROWAVE ABSORBER ATTENUATOR FOR LINEAR SSPA POWER CONTROL

[75] Inventors: William E. McGann, Satellite Beach; John R. Todd, Palm Bay, both of Fla.

[73] Assignees: American Telephone and Telegraph Company, New York, N.Y.; AT&T Bell Laboratories, Murray Hill, N.J.

[21] Appl. No.: 275,692

[22] Filed: Nov. 23, 1988

Related U.S. Application Data

[63] Continuation of Ser. No. 45,414, May 4, 1987, abandoned.

[51] Int. Cl.⁴ .................. H04B 17/00; H01P 1/22; H01P 3/12; H03F 3/60
[52] U.S. Cl. .................... 455/126; 455/67; 455/115; 330/284; 330/286; 333/81 B
[58] Field of Search .......... 455/12, 67, 68, 106, 455/115, 116, 126; 330/278, 284, 286, 291, 302, 56; 333/81 B, 17 R

[56] References Cited

U.S. PATENT DOCUMENTS

| | | | |
|---|---|---|---|
| 2,898,561 | 8/1959 | Hayes | 331/81 B |
| 2,981,907 | 4/1961 | Bundy | 333/81 B |
| 3,624,534 | 11/1971 | Clayworth | 330/284 |
| 3,842,292 | 10/1974 | Kuno | 331/81 B X |
| 4,485,349 | 11/1984 | Siegel et al. | 330/3 |

Primary Examiner—Thomas H. Tarcza
Assistant Examiner—Gilberto Barrón, Jr.
Attorney, Agent, or Firm—Erwin W. Pfeifle

[57] ABSTRACT

The nonlinearity of the frequency response of a solid state power amplifier (SSPA) is obviated by effectively operating the SSPA at the 1 dB compression point, where the nonlinearity does not exist, and controllably reducing, downstream of the SSPA, the power output produced by the SSPA to the level required by the link. In particular, the output is reduced by controllably inserting a relatively thin tapered blade of ferrite material into a waveguide coupling section downstream of the SSPA. Preferably the ferrite material is comprised of a robust carbonyl steel of sufficient thickness to withstand the heat induced in the course of its absorbing microwave energy at the SSPA output, while being of a narrow or thin configuration and oriented for insertion into the absorbing section of waveguide so as to not effectively alter the characteristics of the signal profile of the electromagnetic wave.

16 Claims, 2 Drawing Sheets

MICROWAVE ABSORBER ATTENUATOR FOR LINEAR SSPA POWER CONTROL

This application is a continuation of application Ser. No. 045,414, filed on May 4, 1987, now abandoned.

FIELD OF THE INVENTION

The present invention relates in general to satellite communication systems, and is particularly directed to a scheme for controlling the output power of a microwave solid state power amplifier through the use of ferrite absorber element, the insertion of which into a section of output waveguide is adjustable.

BACKGROUND OF THE INVENTION

Because of its low cost and compact size, the solid state (GaAs) power amplifier (SSPA) is a commonly employed component of the uplink transmitter of a VSAT (very small aperture terminal) Ku band earth station. The (gain) transfer (power output vs. power input) characteristic of a typical SSPA has a positive sloped linear region which gradually decreases over a knee portion to a slightly negative-sloped saturation region. When driven at the 1.0 dB gain compression point, namely at that point on the knee of the transfer characteristic which is 1 dB below an extension of its linear, positive slope region, the frequency response of the SSPA has a substantially smooth profile over its intended operational range.

for currently available SSPAs the output power at the 1 dB gain compression point is on the order of two watts, which may be considerably greater than the power required by the link (e.g. one watt). Consequently, it is necessary to reduce the output power transmitted by the uplink terminal. Ideally, this power reduction would be accomplished by simply reducing the input power to the SSPA, as its output linearly tracks its input over the linear portion of its transfer characteristic below the 1 dB compression point. Unfortunately, the frequency response of the SSPA does not follow suit. Instead, the frequency response drastically departs from the smooth flat profile at 1 dB compression and ripples significantly across the transmit passband.

In copending U.S. patent application entitled "Power Control System for VSAT Earth Station", by William E. McGann, filed Sept. 15, 1986, U.S. Ser. No. 907,009, assigned to the Assignee of the present application now abandoned, there is described a signal processing scheme for compensating for this nonlinear frequency response and additional performance variables (e.g. gain vs. temperature) which essentially comprises a preemphasis mechanism inserted upstream of the SSPA. Now, while the nonlinearity compensation scheme described in that application is certainly a useful technique for solving the nonlinearity problem, it would be preferred, if possible, to operate the SSPA in such a manner to avoid the problem altogether.

SUMMARY OF THE INVENTION

Pursuant to the present invention, the objective discussed above is achieved by effectively operating the SSPA at the 1 dB compression point, where the passband ripple does not exist, and controllably reducing, downstream of the SSPA, the power output produced by the SSPA to the level required by the link. In particular, the present invention is directed to a mechanism for controllably inserting a relatively thin tapered blade of ferrite material into a waveguide coupling section downstream of the SSPA. Preferably the ferrite material is comprised of epoxy-bonded carbonyl steel particles of sufficient thickness to withstand the heat induced in the course of its absorbing microwave energy at the SSPA output, while being of a narrow or thin configuration and oriented for insertion into the absorbing section of waveguide so as to not effectively alter the characteristics of the signal profile of the electromagnetic wave.

DETAILED DESCRIPTION

Figure 1:
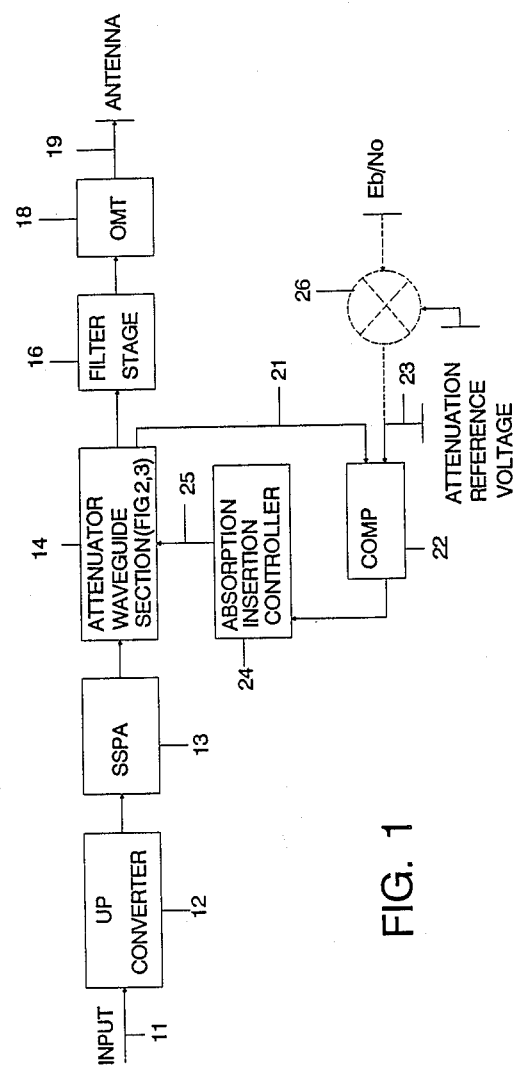
FIG. 1 is a diagrammatic illustration of a VSAT power amplifier section incorporating a waveguide attenuator in accordance with the present invention.

Referring now to FIG. 1, there is illustrated a schematic block diagram of a power control section containing a solid-state power amplifier and attenuator waveguide section incorporated in the up-converter circuitry between the IF input and RF output of a VSAT earth station.

More specifically, an input signal (e.g. an intermediate frequency signal having a frequency of 140 MHz) is coupled to an up-converter 12 of the earth station transmitter. The output of up-converter 12 has a frequency corresponding to the transmission frequency of the earth terminal, as beamed from the earth terminal antenna to the satellite. For purposes of the present description, it will be assumed that this output frequency lies in a Ku band range of 14.0–14.5 GHz. The up-converter 12 is coupled to a solid state power amplifier (SSPA) 13, the output of which is coupled to an attenuator waveguide section 14, the details of which will be described below in conjunction with the description of FIGS. 2 and 3. Attenuator waveguide section 14 serves to controllably attenuate the output of SSPA 13 to the level required by the satellite link. As mentioned briefly above, SSPA 13 is operated at its 1 dB gain compression point so that its frequency response is substantially flat over the range of frequencies of interest (e.g. 14.0–14.5 GHz).

The output of waveguide section 14 is coupled through a waveguide filter stage 16 to an orthomode transducer 18. Waveguide filter stage 16 is comprised of a pair of cascaded filters, specifically a harmonic output rejection filter for SSPA 13 and a receive band noise power rejection filter. The output of orthomode transducer 18 is coupled over link 19 to an antenna feedhorn (not shown).

As mentioned above, the behavioral characteristics of a typical SSPA 13 are such that its gain varies considerably with a change in frequency when operated below its 1 dB gain compression point. Pursuant to the present invention, SSPA 13 is operated at its 1 dB gain compression point so that its output characteristic is substantially flat over the frequency range of interest. For present day VSAT stations, operating in the Ku band, the output power of the terminal may be on the order of several watts or less. (Typically, for a commercially available gallium arsenide SSPA, its 1 dB gain compression point produces an output on the order of two watts.) The power required by the satellite link can be expected to be between one and two watts, so that the output of the SSPA must be reduced. Pursuant to the present invention, rather than reduce the input to the SSPA, which would certainly reduce its output, but would do so by driving the operational state of the SSPA to a gain level that results in a very nonlinear frequency response, the present invention operates the SSPA at a gain where its frequency response is substantially flat (for example at its 1 dB gain compression point) and attenuates the substantially full power output level of the SSPA.

For this purpose, as shown in FIG. 1, the output of attenuator waveguide section 14 is coupled over link 21 to a comparator 22. A second input of comparator 22 is coupled over link 23 to an attenuation reference voltage, corresponding to the desired power level on the satellite output link.

Such an attenuation reference voltage may be derived directly from a manually set voltage source or from a voltage combining circuit (e.g. summing circuit), shown in broken lines at 26 in FIG. 1, the output of which represents the sum or (or difference between) the manually set voltage and one or more monitored systems parameters, such as a signal representative of $E_b/N_o$ used for uplink power control for compensating for a reduction in signal level (e.g. rain fade at the local site). The difference between the actual output produced by attenuator section 14 and the desired level produces a signal at the output of comparator 22 which is supplied to an attenuator insertion controller 24. Attenuator insertion controller 24 is essentially comprised of a linear D actuator which controls the insertion of a ferrite attenuator element to be described below into waveguide section 14.

Figure 2:
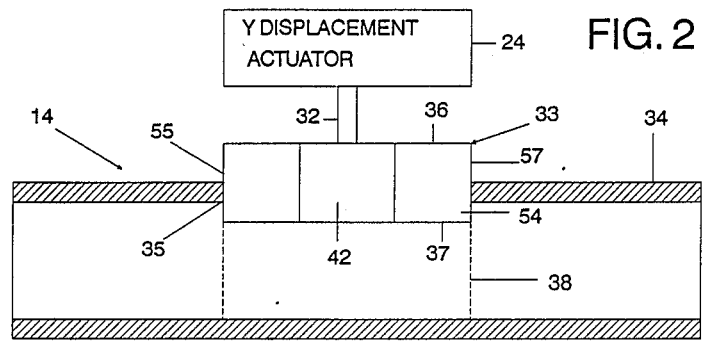
FIGS. 2 and 3 are respective sectional side and end views of the attenuator waveguide section 14 shown in FIG. 1 depicting the manner in which the attenuator element is inserted into the waveguide section.
Figure 3:
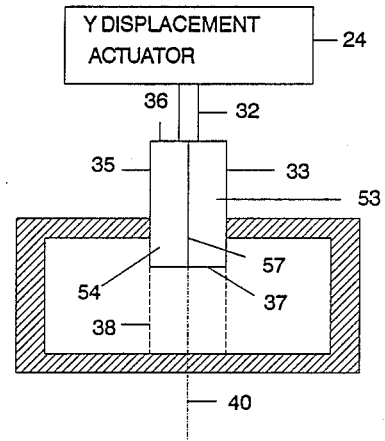

More particularly, with reference to FIGS. 2 and 3, attenuator waveguide section 14 is shown as comprising a rectangular waveguide 34 having a slot 35 at the top thereof which is sized to accommodate a tapered ferrite attenuator element 33. Element 33 is coupled to one end of the output displacement arm of linear DC actuator 24, shown diagrammatically at 32 in FIGS. 2 and 3. As mentioned above, linear actuator 24 displaces its output arm 32 in accordance with the differential signal supplied at the output of comparator 22. The displacement of output arm 32 and, consequently, the degree of insertion of attenuator element 33 through slot 35 in waveguide 34 controls the degree of absorption of the 14.5-15.0 GHz electromagnetic wave travelling through the waveguide. For maximum absorption control, slot 35 is preferably situated in a direction parallel with the longitudinal axis (the z axis) of the waveguide and symmetrical about a center line 40 of the waveguide. The attenuator element itself is preferably comprised of a microwave absorber material that offers both strength and heat dissipation robustness with respect to the electromagnetic energy which is coupled through the waveguide section 34.

For this purpose, element 33 may comprise a tapered blade of magnetically loaded epoxide, such as ECCOSORB MF materials manufactured by Emerson and Cuming. For purposes of the present embodiment, it may be assumed that ECCOSORB MF 117 type material may be employed as absorber element 33.

Figure 4:
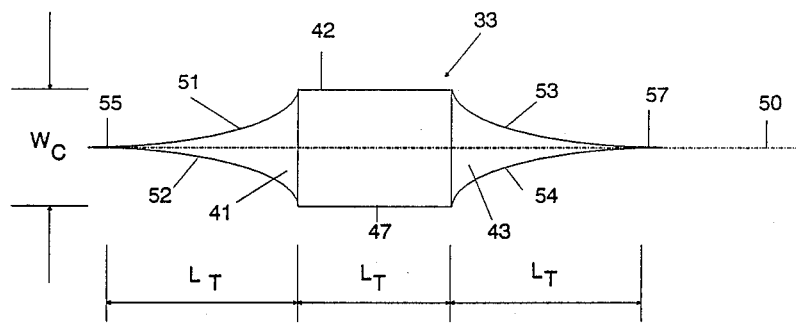
FIG. 4 is a cross-sectional view of the attenuator element 33 employed in the attenuator waveguide section shown in FIGS. 2 and 3.

As shown in the cross-sectional view of FIG. 4, the physical configuration of the absorber element is such that it is symmetrically tapered at regions 41 and 43 about a vertical plane line 50 which is intended to be coincident with the center line 40 of waveguide section 14 when the absorber is inserted into slot 35 at the top of the waveguide shown in FIGS. 2 and 3. Region 41 has a pair of tapered faces 51 and 52 which extend from a pair of parallel sidewalls 46 and 47 and taper to a point 55 at one end of the absorber. At the other end of the absorber, region 43, which is contiguous with a central region 42 of the absorber, has a pair of tapering side faces 53 and 54 which extend to an edge 57. For minimizing the VSWR, the tapering of faces 51-54 follows a Tschebyscheff binomial taper. The length $L_T$ of regions 41 and 43 and the length of $L_C$ of central region 42 between tapered regions 41 and 43, as well as the width or thickness $W_C$ of central region 42 of absorber blade 33, depends upon the size of the waveguide, the frequency of the energy being absorbed, the degree of absorption to be obtained, any external cooling that may be supplied, etc. For purposes of the present description, for providing a variable degree of absorption of up to 15 dB of signals in the frequency range of interest (14.5-15.0 GHz), the dimensions may lie in the following ranges: $0H \leq L_T \leq 0.750$; $0H \leq L_C \leq 0.500$; $0H \leq W_C 0.050$, where the material is ECCOSORB MF 117.

Because the leading and trailing edges 55 and 57, respectively, of the absorber blade 33 are narrowed to a point and the absorber is tapered away from those edges towards its thickness in the central region of the absorber, the electromagnetic wave travelling through the waveguide does not abruptly encounter the absorber material, thereby minimizing its effect on the voltage standing wave ratio.

As shown in FIGS. 2 and 3, the top and bottom surfaces 36 and 37 of absorber 33 are substantially parallel to the top and bottom surfaces of the waveguide 34, the separation between which corresponds to the interior height or b dimension of the waveguide 34. Thus, maximum absorption is provided when the absorber 33 is inserted fully into the waveguide and extends from the top interior surface of the waveguide to the bottom interior surface thereof as delineated by broken lines 38 in FIGS. 2 and 3. For the parametric values recited here, it has been found that the absorber can provide approximately 100 dB of absorption capability when fully inserted into the waveguide. However, in practical use, the range of absorption is on the order of 0-15 dB, to provide the transmitter output power levels mentioned previously.

To form an individual absorber element, a sheet or bar of the absorber material, such as the ECCOSORB MF series of material, manufactured by Emerson & Cuming, may be individually cut and machined to provide the requisite cross-section. Preferably, however, the absorber material, which basically comprises a steel carbonyl microsphere paste, is formed into the prescribed state by molding. This permits the absorber blade element to be inexpensively mass-produced.

Advantageously, the absorber configuration of the present invention is a cost effective alternative to the look-up table frequency response correction scheme for correcting for the nonlinearity of the operation of the SSPA as described in the above-referenced copending application. The present invention may be incorporated into the system described in that application and, in so doing, the monitor and control processor and associated memory through which the frequency response correction is carried out can be eliminated. Specifically, the present invention is inserted at the downstream end of the SSPA, as shown in FIG. 1, while the temperature correction and down link AGC correction networks are retained at the upstream end of the link. The SSPA is operated at its 1 dB compression point to obtain the essentially flat frequency response characteristic.

Controlled insertion of the absorber element into a section of slotted waveguide thereby offers a simple and relatively inexpensive mechanical expedient to the electronically implemented look-up table tracking procedure of the system described in the foregoing application. When combined with the temperature controlled network and downlink AGC correction circuitry, the present invention equips the VSAT with a cost effective power control mechanism for simplifying adjustment of SSPA output power. For maximizing utility of the control network, accordingly, it is preferred that the temperature control and AGC downlink control portions of the system described in the copending application, which form an upstream input controller to the SSPA, be combined with the downstream attenuator absorber mechanism of the present invention.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. For use with a signal amplification network through which input signals to be transmitted over a communication link are coupled, said network including a power amplifier the output power characteristic of which is substantially flat over the frequency range of operation of said amplifier for a first output level of said amplifier, and which is substantially nonlinear over said frequency range of operation for a second output level of said amplifier, a method of operating said network such that signals coupled therefrom effectively correspond to the second output level of said amplifier but the frequency response of which is substantially flat comprising the steps of:

(a) operating said power amplifier such that the signal output level thereof corresponds to said first output level at which the frequency response thereof is substantially flat; and
    (b) adjusting the level of the signal output produced by said power amplifier to said second output level by coupling the output of said power amplifier through a section of waveguide downstream thereof, and controllably inserting a microwave absorber element into said section of waveguide so as to reduce the signal output level to a level less than said first output level.

2. A method according to claim 1, wherein said microwave absorber comprises a body of material having tapered leading and trailing surfaces extending in the direction of transmission of microwave signals through said section of waveguide.

3. A method according to claim 2, wherein said tapered surfaces taper to leading and trailing edges of said absorber such that microwave signals travelling through said section of waveguide gradually encounter the bulk of the material of said absorber.

4. A method according to claim 3, wherein each of the tapered surfaces of each of said tapered body sections has an effectively exponential varying slope between a parallel opposite surface and an edge portion.

5. A method according to claim 4, wherein said absorber is controllably inserted into a slot in said section of waveguide whereat the magnitude of the electric field vector is at a maximum.

6. A method according to claim 1, wherein step (b) comprises controllably inserting said absorber element into said waveguide, and thereby adjusting the level of the signal output produced by said power amplifier, in accordance with a variation in one or more a prescribed operational characteristics of said communication link.

7. A method according to claim 1, wherein said communication link comprises a satellite communication link and step (b) comprises controllably inserting said absorber element into said waveguide, and thereby adjusting the level of the signal output produced by said power amplifier, in response to changes in the uplink power requirements in said satellite communication link.

8. A method according to in claim 7, wherein step (b) comprises controllably inserting said absorber element into said waveguide, and thereby adjusting the level of the signal output produced by said power amplifier, in response to changes in the power level of the electromagnetic energy being transmitted by said waveguide and to changes in uplink power requirements in the satellite communications link.

9. For use with a signal amplification network through which input signals to be transmitted over a communications link are coupled, said network including a power amplifier the output power characteristic of which is substantially flat over the frequency range of operation of said amplifier for a first output level of said amplifier, and which is substantially nonlinear over said frequency range of operation for a second output level of said amplifier, an arrangement for operating said network such that signals coupled therefrom effectively correspond to the second output level of said amplifier but the frequency response of which is substantially flat comprising: first means for operating said power amplifier such that the signal output level thereof corresponds to said first output level at which the frequency response thereof is substantially flat; and second means, coupled to the output of said power amplifier, for adjusting the level of the signal output produced by said power amplifier to said second output level, including a section of waveguide to which output of said power amplifier is coupled, a microwave absorber element insertable into said section of waveguide, and means for controllably inserting said microwave absorber element into said section of waveguide so as to reduce the signal output level to a level less than said first output level.

10. An arrangement according to claim 9, wherein said microwave absorber comprises a body of material having tapered leading and trailing surfaces extending in the direction of transmission of microwave signals through said section of waveguide.

11. An arrangement according to claim 10, wherein said tapered surfaces taper to leading and trailing edges of said absorber such that microwave signals travelling through said section of waveguide gradually encounter the bulk of the material of said absorber.

12. An arrangement according to claim 11, wherein each of the tapered surfaces of each of said tapered body sections has an effectively exponential varying slope between a parallel opposite surface and an edge portion.

13. An arrangement according to claim 9, wherein said second means includes means for controllably inserting said absorber into a slot in said section of waveguide whereat the magnitude of the electric field vector is at a maximum.

14. An arrangement according to claim 9, wherein said second means comprises means for controlling the degree of insertion of said absorber element into said waveguide, and thereby adjusting the level of the signal output produced by said power amplifier, in accordance with a variation in one or more prescribed operational characteristics of said communication link.

15. An arrangement according to claim 9, wherein said communication link comprises a satellite communication link and said second means comprises means for controlling the degree of insertion of said absorber element into said waveguide, and thereby adjusting the level of the signal output produced by said power amplifier, in response to changes in the uplink power requirements in said satellite communication link.

16. An arrangement according to in claim 9, wherein said second means comprises means for controlling the degree of insertion of said absorber element into said waveguide, and thereby adjusting the level of the signal output produced by said power amplifier, in response to changes in the power level of the electromagnetic energy being transmitted by said waveguide and to changes in uplink power requirements in the satellite communications link.

* * * * *